US00RE35260E

United States Patent [19]

Gonzales

[11] E Patent Number: Re. 35,260

[45] Reissued Date of Patent: Jun. 4, 1996

[54] VOLTAGE ROTATION INDICATOR MOUNTING APPARATUS

[75] Inventor: Robert R. Gonzales, Houston, Tex.

[73] Assignee: Houston Industries Incorporated, Houston, Tex.

[21] Appl. No.: 986,978

[22] Filed: Dec. 8, 1992

Related U.S. Patent Documents

Reissue of:

[64] Patent No.: 5,039,936
Issued: Aug. 13, 1991
Appl. No.: 450,289
Filed: Dec. 13, 1989

[51] Int. Cl.[6] ..... G01R 1/00; G01R 31/00

[52] U.S. Cl. ..... 324/108; 324/110; 324/156; 324/508; 324/86; 361/76

[58] Field of Search ..... 324/110, 108, 324/142, 156, 86, 508, 157, 106; 361/76, 364, 369, 372, 374

[56] References Cited

U.S. PATENT DOCUMENTS

| | | | |
|---|---|---|---|
| 1,648,686 | 11/1927 | Holmes | 324/156 |
| 2,115,429 | 4/1938 | Rypinski | 361/372 |
| 2,476,909 | 7/1949 | Ratz | 324/156 |
| 2,643,362 | 6/1953 | Johansson | 324/156 |
| 2,866,436 | 12/1958 | Moore et al. | 324/110 |
| 3,144,602 | 8/1964 | Ramsey, Jr. | 324/110 |
| 3,590,376 | 6/1971 | Mindt et al. | 324/156 |
| 3,683,102 | 8/1972 | Moran et al. | 324/110 |
| 3,714,516 | 1/1973 | Howe et al. | 324/156 |
| 3,999,087 | 12/1976 | Compton | 307/295 |
| 4,110,814 | 8/1978 | Britton et al. | 324/110 |
| 4,333,119 | 6/1982 | Schoenmeyr | 361/76 |
| 4,404,521 | 9/1983 | Fennell | 324/110 |
| 4,751,691 | 2/1986 | Kennon | 324/110 |
| 4,977,482 | 12/1990 | Langdon et al. | 324/156 |
| 5,184,063 | 2/1993 | Eisenhauer | 324/108 |

*Primary Examiner*—Vinh P. Nguyen
*Attorney, Agent, or Firm*—Pravel, Hewitt, Kimball & Krieger

[57] ABSTRACT

A voltage rotation indicator for testing the phase sequence of live multi-phase electrical power is mounted within a housing. The housing is provided with structure for removably mounting the indicator on a meter box or can during voltage rotation testing. Contact plungers extend from the housing and contact meter jaw test points in the meter box during testing. Field personnel are thus not required to insert their hands into the meter box to attach test clips to the live circuit.

21 Claims, 2 Drawing Sheets

VOLTAGE ROTATION INDICATOR MOUNTING APPARATUS

Matter enclosed in heavy brackets [ ] appears in the original patent but forms no part of this reissue specification; matter printed in italics indicates the additions made by reissue.

BACKGROUND OF INVENTION

1. Field of Invention: The present invention relates to testing of electrical power distribution systems.

2. Description of Prior Art: In electrical power distribution it is necessary to test the phase sequence of multiphase electrical power, using voltage or field rotation indicator. To perform such a test, a power meter is removed from its meter box and measurements are made of the field rotation of live three-phase electric power. So far as is known, the meters or indicators presently available have utilized clips for attachment of the indicator to meter jaws of the electrical lines being tested. This required that field personnel manually insert and attach the clips into the meter box in the presence of live electrical power. Even with great care taken, the risk of electrical shock was still present.

SUMMARY OF INVENTION

Briefly, the present invention provides a new and useful improvement in a voltage rotation indicator for testing the phase sequence of multi-phase electrical power. As is conventional, the voltage rotation indicator contains a voltage rotator test circuit and test indicators for testing the phase rotation of multi-phase electric power at meter jaws in a power meter box. According to the improvement of the present invention, a housing is provided for containing the test circuit and the test indicators. Structure is provided for mounting the housing with the power meter box, preferably at an opening formed when the power meter is removed from the meter box for access to the meter jaws. The housing is further provided with contact plungers for electrical connection of the test circuit with the meter jaws. The contact plungers are resiliently urged into contact with the meter jaws when the housing is mounted on the power meter box. Accordingly, field personnel need not place their hands in the meter box when conducting phase rotation tests of live multi-phase electrical power.

DESCRIPTION OF THE PREFERRED EMBODIMENT

Figure 1:
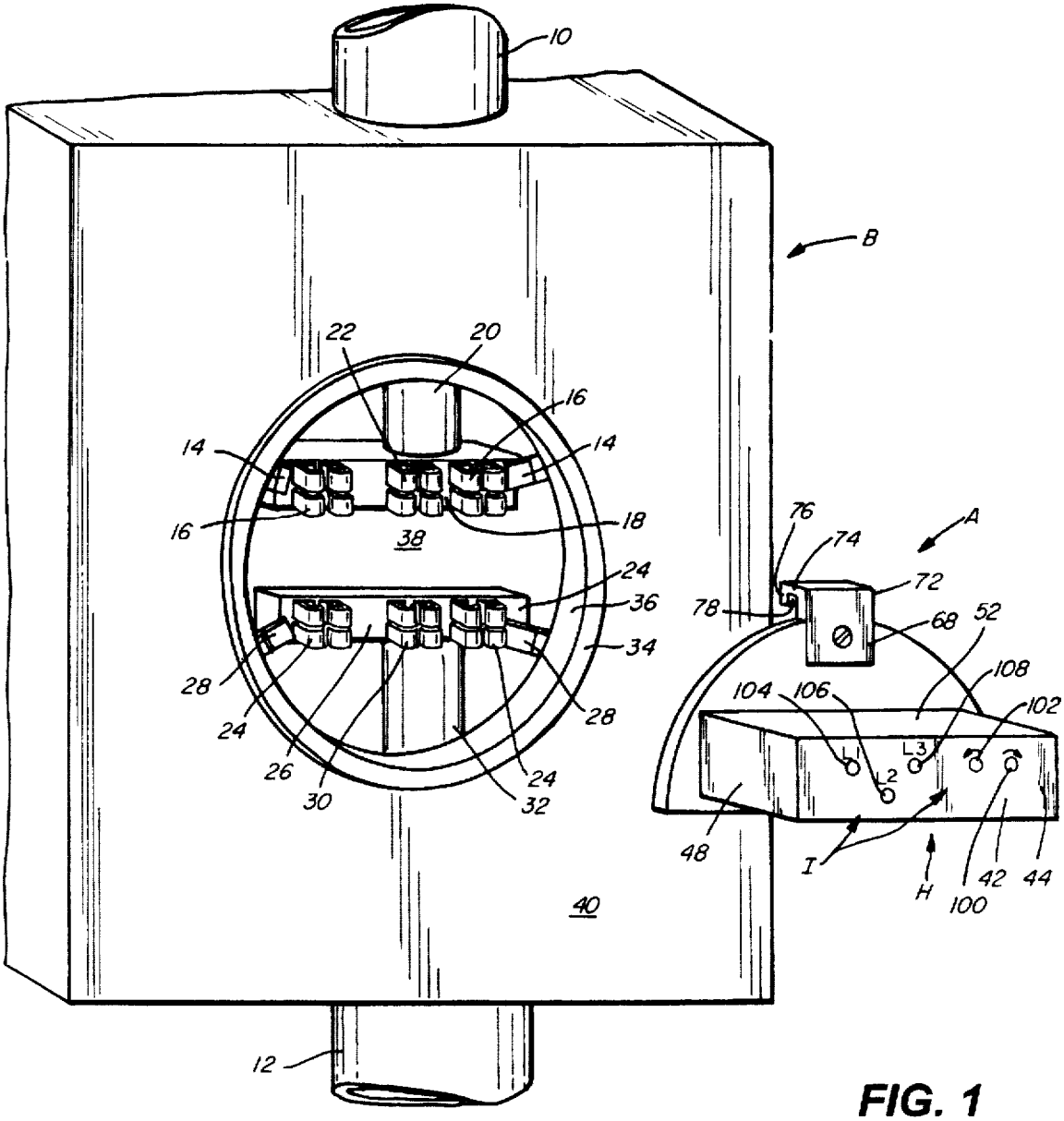
FIG. 1 is an isometric view of a voltage rotation indicator according to the present invention and an electrical power meter box adjacent each other.

In the drawings, the letter A designates generally an apparatus according to the present invention for mounting a voltage rotation indicator V (FIG. 4), which has a voltage rotator test circuit C mounted on a printed circuit board P and a suitable number of indicator lights I (FIG. 1).

The voltage rotator test circuit C, printed circuit board P and indicators lights I are conventional, commercially available items. A suitable example of such items are those sold as the model DR700 Unitest rotary field indicator under the trademark BEHA (with gear design) of Ch. BEHA GmbH Technische Neuentwicklunge of Glottertal, West Germany. It should be understood, however, that other commercially available items may be equally as well used, if desired.

The apparatus A is used for testing the phase rotation of multi-phase electrical power at a meter box B. As is conventional, meter box B is provided with an incoming conduit 10 and an outgoing external conduit 12 for providing protective cover for plural electric conductors conveying multi-phase, typically three-phase, electrical power to an electrical load. Within the meter box B, the incoming individual electrical conductors are physically separated from each other so that the outer conductors conveying two of the phases of electrical power may be connected by connector tabs 14 to an outer pair of meter jaws 16 on an insulator bar 18. The center incoming conductor conveying the third phase of electrical power is mounted within an internal conduit 20 and connected from behind to a center meter jaw 22 on the insulator bar 18.

Outgoing electrical power from a first two of the electrical power phases is separately conveyed from an outer pair or meter jaws 24 mounted on an insulator bar 26 through connector tabs 28 and therefrom through conductors extending into the outgoing electrical conduit 12 to the load. The third phase of outgoing electrical power is conducted into a central meter jaw 30 on insulator bar 26 to a conductor in an internal conduit 32 to the outgoing electrical conduit 12 and therefrom to the load.

In normal service use, the three-phase electrical power being provided to the load is conveyed from the meter jaws 16 and 22 into an upper set of connecting plugs or terminals of a conventional electrical power meter which fit within such jaws. The electrical power passes through the meter, where the rate of power usage is measured, and then passes from a lower set of conventional connector terminals of the power meter into the meter jaws 24 and 30. The electrical power then passes through conductors to the load. The power meter when in use is mounted with a circular mounting rim 34, formed on a cylindrical collar 36 defining an opening 38, in a front face 40 of the meter box B. Before connecting the load to the multi-phase electrical power, it is necessary to test the voltage or phase rotation of the multi-phase electrical power to insure that the phase rotation is proper to prevent damage to the load. The voltage rotation indicator V is used for this function before the power meter is connected to the meter box B.

The apparatus A, which contains the voltage rotation indicator V (FIG, 4), includes a housing H containing the indicator test rotator circuit C, its printed circuit board P and the indicator lights I. The indicator lights I are visible through openings 42 (FIG. 4) formed in a rear wall 44 (FIG. 1) of the housing H. The printed circuit board P is mounted on a lower wall 46 (FIG. 4) of the housing H and is contained within a space within the housing H defined by side walls and 50 and a top wall 52.

Figure 2:
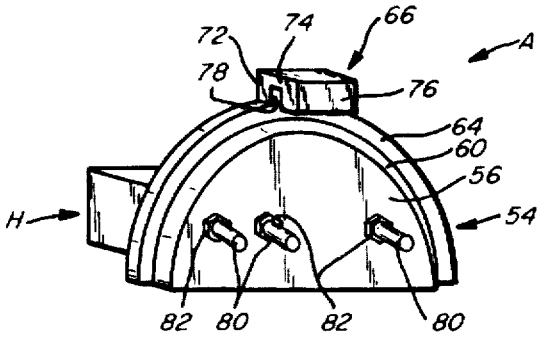
FIG. 2 is an isometric view of a voltage rotation indicator to the present invention.
Figure 4:
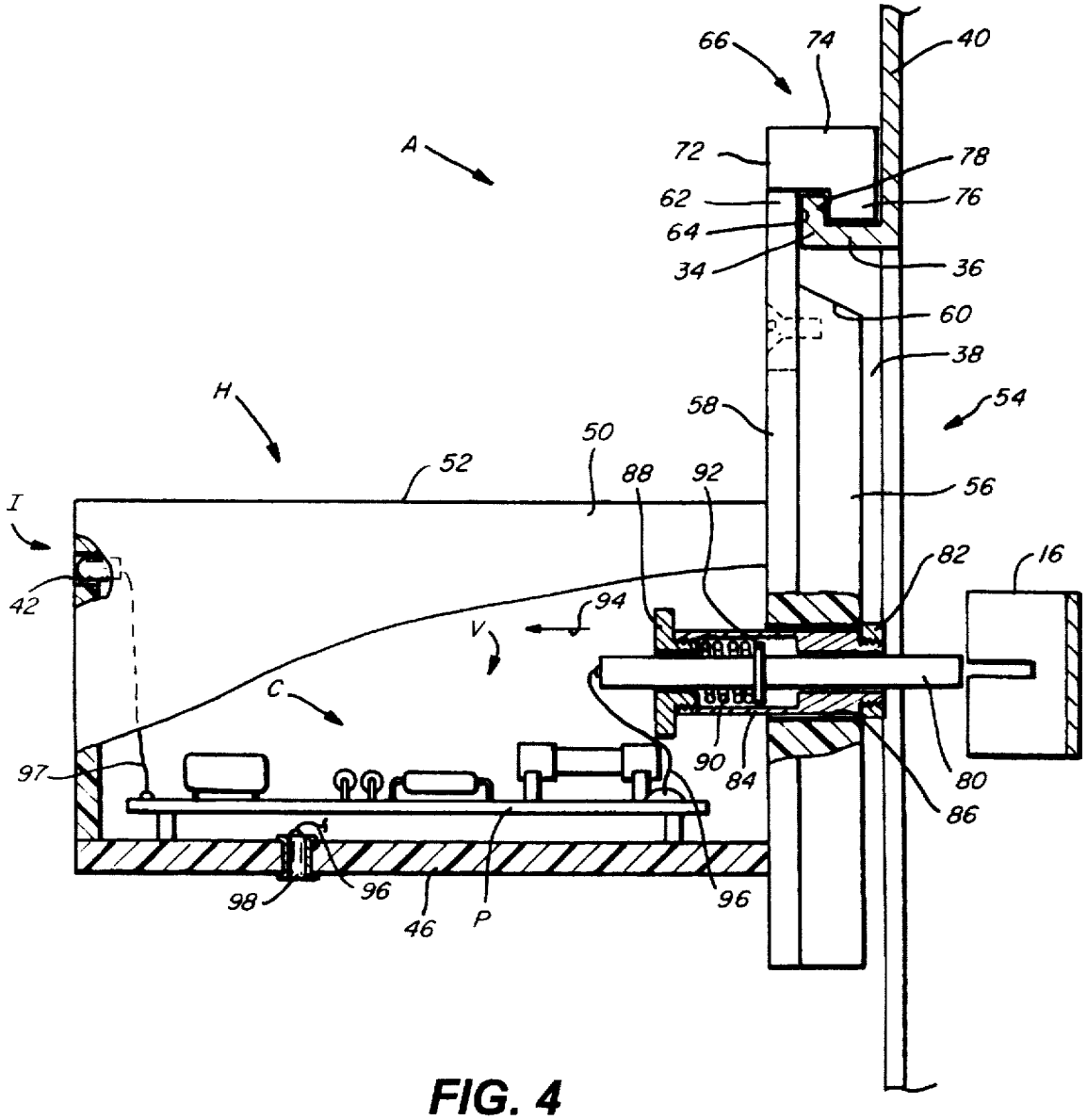
FIG. 4 is a side elevation view, taken partly in cross-section, of a voltage rotation indicator according to the present invention mounted on an electrical power meter box.

The housing H is closed at an end opposite the rear wall 42 by a semicircular face plate 54 (FIGS. 2 and 4). The face plate 54 may also be other than semicircular, for example taking the form of a segment of a circle. The face plate 54 has an inner portion 56 conforming to a portion of the opening 38 in the front face 40 of the meter box B. The inner portion 56 of the face plate 54 extends inwardly from an outer portion 58 of the face plate 54 and is insertable into the opening 38. The inner portion 56 of the face plate 54 further has an inwardly tapered shoulder surface 60 formed thereon. The tapered shoulder surface 60 provides a camming action, when needed, to aid in attaching the face plate 54 in the housing H to the mounting rim 34 of the meter box B.

The outer portion 58 of the face plate 54 has a rim 62 extending outwardly from the inner portion 56 for engagement with a front face 64 of the mounting rim 34 of the meter box B. A hanger jaw 66 serves to hang or attach the face plate 54 and the housing H from the mounting rim 34. The hanger jaw 66 is attached at a lower rear portion 68 by a suitable bolt or screw 70, which extends through a hanger jaw 66 into the outer portion 58 of the face plate 54.

The hanger jaw 66 extends upwardly from its lower rear portion 68 to a central body portion 72 which fits over and extends upwardly from the rim 62 of the face plate 54. The hanger jaw 66 has an arm 74 inwardly extending from the central portion 72 to a downwardly extending lip 76. The lip 76, arm 74 and central portion 72 of hanger jaw 66 define a slot 78 formed to receive the mounting rim 34 of the meter box B. Preferably, the slot 78 has dimensions conforming to those of the rim 34, so that the rim 34 is snugly fitted in the slot 78 when the apparatus A is mounted on the meter box B.

Figure 3:
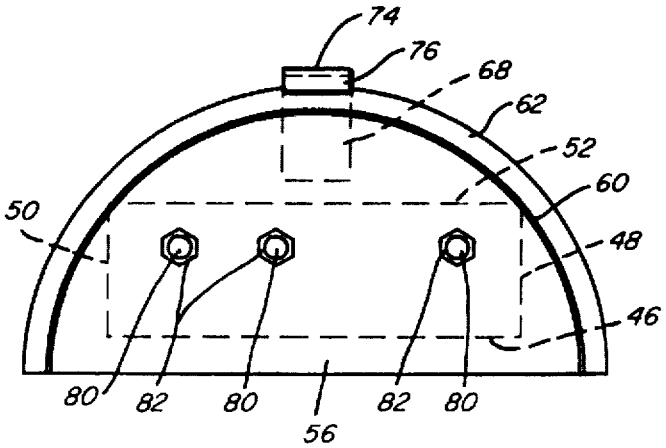
FIG. 3 is a front elevation view of a voltage rotation indicator according to the present invention.

The housing H has a plurality of electrical contact plungers 80 mounted therewith for separately electrically connecting the test circuit C with each of the meter jaws 16 and 22. The electrical contact plungers 80 extend outwardly from connector nuts 82 mounted on the inner portion 56 of the face plate 54. The electrical contact plungers 80 are mounted at positions (FIG. 3) conforming to the spacing of the meter jaws 16 and 22 on the insulator bar 18 in the meter box B.

The electrical contact plungers 80 extend through the inner portion 56 of the face plate 54 into plunger container sleeves 84 mounted in openings 86 formed in the face plate 54. The plunger container sleeves 84 are connected to the connecting nuts 82 and thus to the face plate 54. The plungers 80 extend through rear plates 88 at the rear of the plunger sleeve 84.

A bias spring 90 is mounted within each of the plunger sleeves 84 between the rear plate 80 and a plunger disk 92. Each plunger disk 92 is fixedly mounted on its associated contact plunger 80, normally biasing same outwardly to its furthest extent (FIG. 2). The bias springs 90 thus resiliently urge the contact plungers 80 outwardly. However, when electrical contact is made by the contact plunger 80 with a meter jaw, such as meter jaws 16 or 22 (FIG. 4), the bias springs 90 yield, permitting the contact plungers 80 to move rearwardly, as indicated by an arrow 94. When this occurs, the bias springs 90 continue to resiliently urge the contact plungers 80 into contact with the meter jaws, particularly when the housing H is mounted on the power meter box B. Flexible electrical conductors 96 are mounted in electrical connection with each of the contact plunger 80 within the housing H to electrically connect the plungers 80 separately to the printed circuit board P and the test circuit C thereon. Conductors 97 are provided to separately connect the test circuit C to each of the indicator lights I. If desired, a probe socket 98 may be mounted in one of the walls of the housing H and be electrically connected to one of the conductors 96 to permit testing of the voltage of the electrical power being delivered.

In the operation of the present invention, after incoming electrical power has been wired to the meter box B and before the power meter is installed thereon, a test operator fits the slot 78 of the hanger jaw 66 over the rim 34 on the meter box B at a position where the contact plungers 80 are aligned with the meter jaws 16 and 22 which have live electrical power thereon. Electrical current passes from the meter jaws through the contact plungers 80 and the conductors 96 to the rotation indicator test circuit C on the printed circuit board P.

It is to be noted that in attaching the apparatus A to the meter box B, it is unnecessary for the meter operator to insert a hand or conductor into the meter box B, which contains live electrical power at the meter jaws on the insulator bar 18. This greatly reduces the risk of accidental contact with the live electrical power, also reducing the possibility of electrical shock or injury to the operator.

After the voltage rotation indicator V has been mounted by the apparatus A to the meter box B, the operator may then check the indicator lights I to check the phase sequence. A first indicator light 100 if energized indicates that the phase is in proper forward rotation, while a second indicator light 102 indicates that the phase sequence is in a reverse rotation. Indicator lights 104, 106 and 108 indicate, respectively, whether a first (or A) phase, a second (or B) phase and a third (or C) phase of the multi-phase power connection are opened, by remaining unlit. This occurs while the remainder of the indicators I, including the indicator lights 100 and 102, are emitting light.

After the phase rotation has been tested with the indicator V, an operator need merely lift the housing H upwardly, moving the rim 34 on the meter box B out of the slot 78 on the hanger jaw 66, again without requiring the operator to insert a hand or a connector into the meter box B. Assuming that the voltage rotation tested satisfactorily, a conventional electrical power meter may then be attached to the mounting rim 34 of the meter box B, permitting the passage of electrical power therethrough.

Having described the invention above, various modifications of the techniques, procedures, material and equipment will be apparent to those in the art. It is intended that all such variations within the scope and spirit of the appended claims be embraced thereby.

I claim:

1. In a voltage rotation indicator having a voltage rotator test circuit and test indicators for testing the phase rotation of multi-phase electric power at meter jaws in a power meter box, the improvement comprising:

housing means for containing said test circuit and said test indicators;

means for mounting said housing means on the power meter box;

means with said housing for electrically connecting said test circuit with the meter jaws; and means for resiliently urging said means for electrically connecting into contact with the meter jaws when said housing means is mounted on the power meter box.

2. The invention of claim 1, wherein the [power meter] *indicator* is removably mounted to a mounting rim of the power meter box to form an opening for access to the meter jaws, and wherein said means for mounting comprises:

means for mounting said housing means on the mounting rim of the power meter box.

3. The invention of claim 2, wherein said means for mounting comprises:

a face plate having said housing means mounted therewith; and means for attaching said face plate to the mounting rim of the power meter box.

4. The invention of claim 3, wherein said means for attaching said [fact] *face* plate comprises:

means for hanging said face plate from the mounting rim of the power meter box.

5. The invention of claim 4, wherein said means for hanging comprises:

a hanger jaw having a slot formed therein to receive the mounting rim of the power meter box.

6. The invention of claim 4, wherein said means for hanging comprises:

a hanger jaw having a slot formed therein conforming to the mounting rim of the power meter box.

7. The invention of claim 4, wherein:

said means for hanging is mounted extending upwardly from aid face plate.

8. The invention of claim 3, wherein:

said face plate has an inner portion conforming to the opening in the power meter box and insertable therein.

9. The invention of claim 8, wherein:

said inner portion of said face plate has a tapered shoulder formed thereon to [aid] *said* in attaching of said face plate to the mounting rim of the power meter box.

10. The invention of claim 8, wherein:

said face plate has an outer portion having a rim extending outwardly from said inner portion for engagement with a front face of the mounting rim of the power meter box.

11. The invention or claim 10, wherein said means for attaching comprises:

a hangar jaw having a slot formed therein to receive the mounting rim of the power meter box;

said hanger jaw being mounted extending upwardly from said rim of said outer portion of said face plate.

12. The invention of claim 1, wherein:

said housing means has openings formed therein for viewing of said test indicators.

13. The invention of claim 1, wherein said means for electrically connecting comprises:

contact plunger means for fitting into the meter jaws.

14. The invention of claim 13, wherein meter jaws are present in the meter box for each phase of the multi-phase electric power, and wherein said means for electrically connecting comprises:

plural contact plunger means, each adapted to individually fit into a separate one of the meter jaws.

15. The invention of claim 14, wherein said means for resiliently urging comprises:

bias spring means for resiliently urging said contact plunger means into the meter jaws.

*16. In a voltage rotation indicator having a voltage rotator test circuit and test indicators for testing phase rotation of multi-phase electric power at meter jaws in a power meter box, the improvement comprising:*

*housing means having an interior space for containing said test circuit;*

*means for mounting the housing means on the power meter box;*

*electrical contact plungers in electrical contact with the test circuit, a portion of each of the plungers extending outwardly from the housing and spaced apart at distances corresponding to distances between meter jaws, so that when the housing means is mounted on the power meter box, the outwardly extending plunger portions are in electrical contact with the meter jaws; and*

*means for resiliently urging at least one of said electrical contact plungers into contact with the meter jaws when said housing means is mounted on the power meter box.*

*17. The invention of claim 16 wherein the means for mounting comprises:*

*means for mounting said housing means on a rim surrounding an opening in a front face of the power meter box.*

*18. The invention of claim 16 wherein the means for mounting comprises:*

*a face plate having said housing means mounted therewith; and*

*means for hanging said face plate onto the rim of the power meter box.*

*19. The invention of claim 18 wherein the means for hanging comprises a hanger jaw with a slot formed therein to receive the rim of the power meter box.*

*20. In a voltage rotation indicator test circuit and test indicators for testing the phase rotation of multi-phase electric power at meter jaws accessible at an opening adjacent a mounting rim in a power meter box to which a power meter is normally connected, the improvement comprising:*

*housing means for containing said test circuit and said test indicators;*

*means for mounting said housing means on the mounting rim of the power meter box; and*

*means with said housing for electrically connecting said test circuit with the meter jaws when the housing means is mounted on the power meter box,*

*wherein said means for mounting comprises:*

*a face plate having said housing means mounted therewith, said face plate having an inner portion conforming to the opening in the power meter box and insertable therein; and*

*means for attaching said face plate to the mounting rim of the meter box.*

*21. The invention of claim 20 wherein:*

*said inner portion of said face plate has a tapered shoulder formed thereon to aid in attaching of said face plate to the mounting rim of the power meter box.*

* * * * *